United States Patent [19]

Ansari et al.

[11] Patent Number: 4,918,524
[45] Date of Patent: Apr. 17, 1990

[54] HDTV SUB-BAND CODING USING IIR FILTER BANK

[75] Inventors: Rashid Ansari, Hillsborough Township, Somerset County, N.J.; Antonio Fernandez, Brooklyn, N.Y.

[73] Assignee: Bell Communications Research, Inc., Livingston, N.J.

[21] Appl. No.: 323,488

[22] Filed: Mar. 14, 1989

[51] Int. Cl.$^4$ ............................................. H04N 7/12
[52] U.S. Cl. ...................................... 358/133; 358/138; 364/724.1
[58] Field of Search .................... 358/133, 138, 11, 12, 358/141, 142, 166, 167; 364/724.01, 724.1, 725, 724.16, 724.17

[56] References Cited

U.S. PATENT DOCUMENTS

| | | | |
|---|---|---|---|
| 4,542,475 | 9/1985 | Acampora | 358/37 |
| 4,815,023 | 3/1989 | Arbeiter | 364/724.01 |
| 4,829,367 | 5/1989 | Dubois et al. | 358/12 |
| 4,829,378 | 5/1989 | LeGall | 358/12 |

OTHER PUBLICATIONS

"Digital Coding of Speech in Sub-bands," R. E. Crochiere et al., The Bell System Technical Journal, vol. 55, No, 8, pp 1069-1085, Oct. 1976.
"Sub-band Coding of Images," J. W. Woods et al., IEEE Trans. on Acoust., Speech, Signal Processing, vol. ASSP-34, No. 5, pp. 1278-1288, Oct. 1986.
"Multi-Dimensioned Sub-Band Coding: Some Theory and Algorithms," M. Vetterli, Signal Processing, vol. 6, pp. 97-112, Apr. 1988.
"Sub-Band Coding of Images Using Predicture Vector Quantization," P. H. Westerink et al., IEEE International Conf. on Acoust., Speech, Signal Processing, ICASS 87, pp. 1378-1381, Dallas, Apr. 1987.
"Sub-band Coding of Digital Images Using Symmetric Short Kernel Filters and Arithmetic Coding Techniques," D. LeGall et al., PROC IEEE Int. Conf. on Acoust., Speech, Signal Processing, pp. 761-763, Apr. 1988.
"Two Dimensional IIR Filters for Exact Reconstruction in Tree-Structured Sub-Band Decomposition," R. Ansari et al., Electronic Letters, vol. 23, pp. 633-634, Jun. 1987.
"IIR Filter Bank for Sub-band Coding of Images," T. A. Ramstad, ISCAS '88, pp. 827-830.

Primary Examiner—John K. Peng
Attorney, Agent, or Firm—James W. Falk

[57] ABSTRACT

A technique for the sub-band decomposition and reconstruction of video signals is disclosed. In an illustrative embodiment of the present invention, each field of a video signal is decomposed into sub-bands utilizing a polyphase filter bank unit including an infinite impulse response allpass filter with coefficients that are powers of two. To reconstruct the original image, an FIR is utilized which approximates an IIR allpass filter This eliminates the need for a full field memory in the reconstruction process.

7 Claims, 3 Drawing Sheets

HDTV SUB-BAND CODING USING IIR FILTER BANK

FIELD OF THE INVENTION

The present invention relates to a video signal data compression technique for transmission known as sub-band coding. More particularly, the present invention relates to a class of digital filters which permits use of the sub-band coding technique for video signals, such as high definition television (HDTV) signals, with a minimum of computational complexity. Use of the present invention enables HDTV signals to be transmitted at rates below 135 Mbits/sec.

BACKGROUND OF THE INVENTION

Sub-band coding refers to a technique where, by the parallel application of a set of analysis filters, an input signal is decomposed into several sub-band signals that are separately coded for the purpose of transmission. For reconstruction after transmission, the individual sub-band signals are decoded and filtered using a set of synthesis filters in order to reproduce the original signal. Sub-band coding was first developed in connection with the coding and transmission of speech signals. (See e.g., R. E. Cochiere et al, "Digital Coding of Speech in Sub-bands BSTJ", Vol. 55, pp. 1069–1085).

For the sub-band coding and transmission of a video signal, separable analysis filter banks are applied first horizontally then vertically to each field of a video signal. Application of a filter bank, comprising two filters, first horizontally then vertically, gives rise to an analysis of a video signal into four frequency sub-band signals: horizontal-low, vertical-low; horizontal-low, vertical-high; horizontal-high, vertical-low; horizontal-high, vertical-high. Each resulting sub-band signal is encoded according to its own statistics for transmission from a transmitting station to a receiving station. At the receiving station the individual sub-band signals are decoded and the original signal is reconstructed using vertical and horizontal synthesis filter banks.

A very important part of the design of a sub-band coding system is the choice of the analysis and synthesis filter banks that are used to decompose and reconstruct the original video signal.

A requirement imposed on the filter banks is that in the absence of coding and quantization distortion, the filter banks should provide a substantially exact reconstruction of the sub-band coded signal. In view of the large amount of data that needs to be processed for the decomposition and reconstruction of video signals such as HDTV signals, a further requirement for the sub-band coding of a video signal is that the signal processing algorithms carried out by the analysis and synthesis filters be simple enough to allow low cost real time implementation. However, the two above-mentioned requirements—i.e., the requirement for exact reconstruction of sub-band coded signals and the requirement for the filters to carry out simple signal processing algorithms—severely limits the choice of filters.

Up to now, the sub-band coding of video signals has been carried out primarily using finite impulse response (FIR) filter banks. However, such FIR filter banks are generally quite complex, especially for the real-time decomposition and reconstruction of video signals. See e.g., J. W. Woods et al., "Sub-band Coding of Images", IEEE Trans. on Acoust., Speech, Signal Processing, Vol. ASSP-34 No. 5 pp. 1278–1288, October '86; M. Vetterli "Multi-Dimensioned Sub-band Coding: Some Theory and Algorithms", Signal Processing Vol. 6 pp. 97–112 April 1988; P. H. Westerink et al., "Sub-band Coding of Images Using Predicture Vector Quantization." IEEE International Conf. on Acoust., Speech, Signal Processing, ICASS 87, pp. 1378–1381, Dallas, April 1987.

In addition to the requirements mentioned above, for the sub-band coding of video signals, it is desirable to use filters whose responses exhibit phase linearity. Phase linearity allows the creation of a hierarchical signal representation wherein the sub-band signal carrying the low frequency information can be displayed without significant distortion. For example, when an HDTV signal is sub-band coded, the horizontal-low, vertical-low sub-band signal can be utilized by itself by a non-HDTV receiver. A set of especially simple linear phase FIR filters for the sub-band coding of video signals is disclosed in D. J. LeGall et al, "Sub-band Coding of Digital Images Using Short Kernel Filters and Arithmetic Coding Techniques", PROC IEEE Int. Conf. on Acoust., Speech, Signal Processing, April 1988.

As an alternative to FIR filters, infinite impulse response (IIR) filters may be considered. (See R. Ansari et al., "Two dimensional IIR Filters for Exact Reconstruction in Tree-Structured Sub-band Decomposition", Electronic Letters, Vol. 23, pp. 633–634, June 1987 and T. T. Ramstad, "IIR Filter Bank for Sub-band Coding of Images", ISCAS '88 pp 827–830). The use of IIR filters is motivated by the fact that IIR filters often produce sharper filter cut-offs with lower filter orders. Previous attempts (see e.g. the Ramstad reference, supra) to apply IIR filters to the sub-band decomposition and reconstruction of video images have resulted in IIR filters whose implementation is too complex to be practical in real HDTV systems. In particular, such conventional IIR filters, when utilized in connection with the sub-band decomposition and reconstruction of HDTV signals, require extremely high processing speeds and the synthesis filter banks would require memory capacity for a full field of video.

Accordingly, it is an object of the present invention to provide filters for use in connection with the sub-band decomposition and reconstruction of video images which are simple to implement. In particular, it is an object of the present invention to provide approximately linear phase filters with simple coefficients which enable an original signal to be analyzed and synthesized with minimal computational complexity and which enable substantially exact reconstruction of the original signal.

SUMMARY OF THE INVENTION

The present invention is a sub-band coding technique for video signals in which the analysis and synthesis filters are of minimal computational complexity. In particular, to analyze a video signal, polyphase filter banks are utilized. Polyphase filter banks allow a high sample rate signal to be split into two sample streams at half the rate. One stream of samples is processed by an IIR allpass filter. The sum and difference of the allpass filter output with the other sample stream yield downsampled low frequency band and high frequency band signals respectively.

To avoid the need for a full field memory in the synthesis filter banks, the IIR allpass filter is approximated by an FIR filter which does not require a full field memory.

In the allpass filter of the analysis filter banks, the filter coefficients are all powers of two. Similarly in the FIR filter of the synthesis filter banks, the filter coefficients are all powers of two or sums of two powers of two. Thus, no multiplications are required to implement the filters, thereby significantly reducing the amount of processing required by each filter.

DETAILED DESCRIPTION

Figure 1:
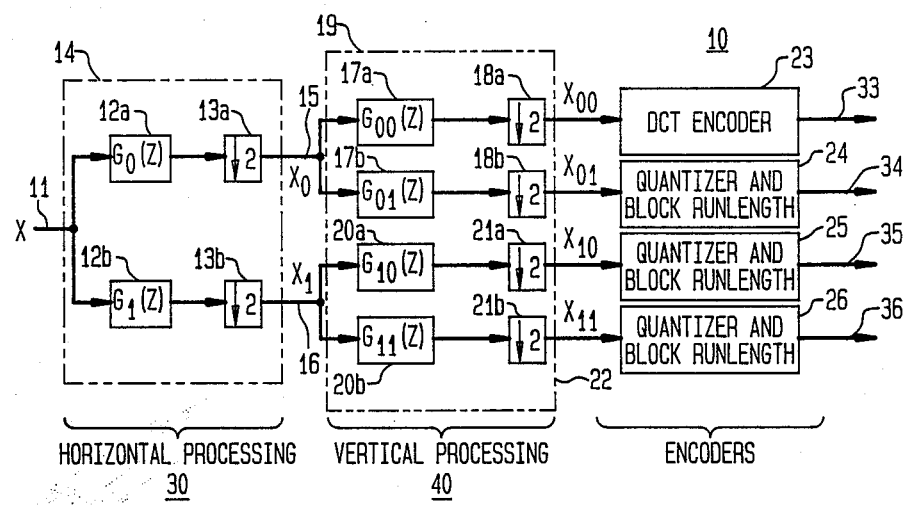
FIG. 1 schematically illustrates a transmitting station of a sub-band transmission system for video signals, wherein a video signal is decomposed into four sub-band signals in accordance with an illustrative embodiment of the invention.
Figure 2:
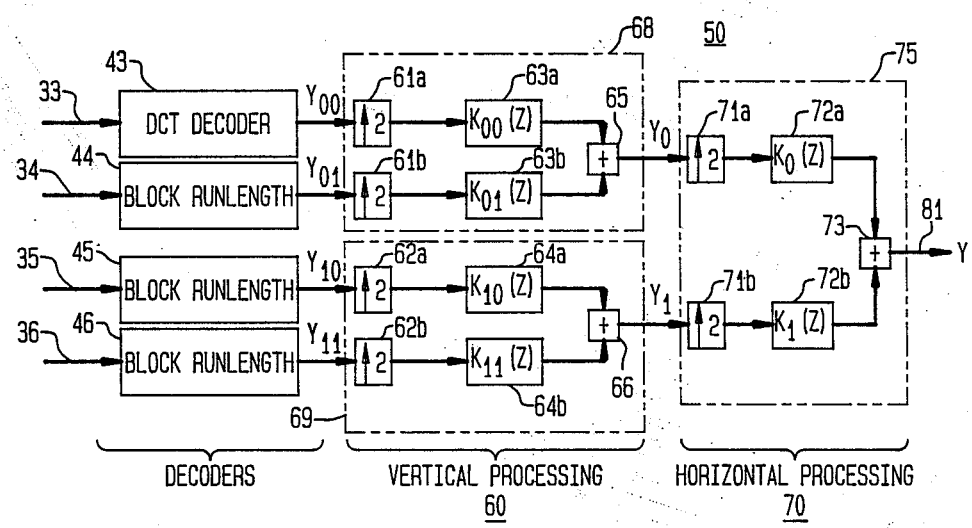
FIG. 2 schematically illustrates a receiving station of a sub-band transmission system for video signals, wherein a video signal is reconstructed from four sub-band signals in accordance with an illustrative embodiment of the present invention.

A sub-band video transmission system is schematically illustrated in FIGS. 1 and 2. FIG. 1 illustrates the transmitting station 10 of the system and FIG. 2 illustrates the receiving station 50 of the system. FIGS. 1 and 2 are block diagrams which indicate the signal processing functions performed at the transmitting of station 10 and receiving station 50, respectively. Actual implementations are discussed below in connection with FIGS. 3-7.

As shown in FIG. 1, a discrete time video signal X to be transmitted arrives at the transmitting station 10 via line 11. To decompose the signal X into two horizontal sub-band signals, the signal X is filtered by the horizontal filters 12a, 12b which have transfer functions $G_0(z)$ and $G_1(z)$, respectively. The resulting signals are then downsampled by the downsampling operators 13a, 13b. As used herein, the term downsampling refers to a signal processing operation wherein some of the sample values comprising a discrete time signal are eliminated to reduce the rate of the signal. In the downsampling operators 13a, 13b of FIG. 1, the downsampling is 2:1. This means that one out of every two samples is removed.

The filters 12a, 12b and downsampling operators 13a, 13b form a filter bank unit 14 which processes the input video signal X in the horizontal direction. The output of the filter bank unit 14 is the horizontal-low frequency band signal $X_0$ on line 15 and the horizontal-high frequency band signal $X_1$, on line 16.

Each of the sub-bands $X_0$, $X_1$ produced by the filter bank unit 14 is then divided into two further sub-band signals by means of vertical filter bank units so that there is a total of four sub-band signals. The signal $X_0$ is divided into two further sub-band signals through use of the vertical filters 17a, 17b which have the transfer functions $G_{00}(z)$, $G_{01}(Z)$ respectively. The resulting signals are then downsampled by a factor of two using the downsampling operators 18a, 18b. The filters 17a, 17b and downsampling operators 18a, 18b form a first vertical filter bank unit 19 whose output signals $X_{00}$ and $X_{01}$ are in the horizontal-low, vertical-low band; and the horizontal-low, vertical-high band, respectively.

Similarly, the signal $X_1$ is processed by the filters 20a, 20b having the transfer functions $G_{10}(z)$, $G_{11}(z)$, respectively. The resulting signals are downsampled by a factor of two by the downsampling operators 21a, 21b. The filters 20a, 20b and downsampling operators 21a, 21b form a second vertical filter bank unit 22 whose output signals $X_{10}$ and $X_{11}$ are in the horizontal-high, vertical-low band and the horizontal-high, vertical-high band, respectively.

In short the input signal X on line 11 is analyzed into four sub-band signals $X_{00}$, $X_{01}$, $X_{10}$ and $X_{11}$ by first processing the signal X in the horizontal direction using the horizontal processing stage 30 which comprises the filter bank unit 14 to produce the signals $X_0$, and $X_1$. The signals $X_0$ and $X_1$ are then processed using the vertical processing stage 40 which comprises the filter bank units 19, 22.

The resulting signals $X_{00}$, $X_{01}$, $X_{10}$, $X_{11}$ are encoded using the coding units 23, 24, 25, 26. Most of the signal energy is concentrated in the horizontal-low, vertical-low sub-band signal $X_{00}$. Thus, the signal $X_{00}$ is encoded using a discrete cosine transform (DCT) coder 23. The remainder of the sub-band signals $X_{01}$, $X_{10}$, $X_{11}$ are quantized and run-length coded using the coders 24, 25, 26. The resultant coded sub-band signals are then transmitted to a remotely located receiving station via the lines 33, 34, 35, 36.

Such a receiving station 50 is illustrated in FIG. 2. The coded sub-band signals from the transmitting unit 10 of FIG. 1 arrive at the receiving unit 5 via the lines 33, 34, 35, 36. These sub-band signals are then decoded using the decoders 43, 44, 45, 46 to produce the sub-band signals $Y_{00}$, $Y_{01}$, $Y_{10}$, $Y_{11}$. In particular, the horizontal-low, vertical-low sub-band signal is decoded using the DCT decoder 43 and the remainder of the coded sub-band signals are run length decoded.

The signals $Y_{00}$, $Y_{01}$, $Y_{10}$, $Y_{11}$, are processed by the vertical processing stage 60 and horizontal processing stage 70 to produce a signal Y on line 81. Desirably, the signal Y on line 81 is an exact reconstruction of the signal X on line 11 of FIG. 1.

The first step in the synthesis operation is a vertical upsampling step which is carried out by the upsampling operators 61a, 61b, 62a, 62b. Upsampling involves increasing the rate of a signal by increasing the number of samples comprising the signal by inserting samples having a zero value. The number of samples in each of the sub-band signals $Y_{00}$, $Y_{01}$, $Y_{10}$, $Y_{11}$ signal is increased by a factor of two using the upsampling operators 61a, 61b, 62a, 62b.

The next step in the synthesis operation is to decrease the number of sub-bands from four to two. Thus, the sub-band signals, $Y_{00}$, $Y_{01}$, after upsampling by the upsampling operators 61a, 61b l *are processed by the filters 63a, 63b* having transfer functions $K_{00}(z)$, $K_{01}(z)$, respectively. The outputs of the filters 63a, 63b are summed by the adder 65 to produce the sub-band signal $Y_0$. Similarly, the sub-band signals $Y_{10}$, $Y_{11}$, after upsampling by the upsampling operators 62a, 62b, are processed by the filters 64a, 64b having the transfer functions $K_{10}(z)$, $K_{11}(z)$, respectively. The outputs of the filters 64a, 64b are summed using the adder 66 to produce the sub-band signal $Y_1$.

In the vertical processing stage 60, the upsampling operators 61a, 61b, the filters 63a, 63b and the adder 65 form a first filter bank unit 68. Similarly, the upsampling operators 62a, 62b, the filters 64a, 64b and the adder 66 form a second filter bank unit 69. The first synthesis filter bank unit 68 combines the horizontal-low, vertical-low sub-band signal and the horizontal-low, vertical-high sub-band signal to produce the horizontal-low sub-band signal $Y_0$. Similarly, the synthesis filter bank 69 combines the horizontal-high, vertical-low sub-band signal and the horizontal-high, vertical-high sub-band signal to produce the horizontal-high sub-band signal $Y_1$.

There are now only two sub-band signals $Y_0$, $Y_1$. Each of these remaining sub-band signals is upsampled by a factor of two using the upsampling operators 71a, 71b 1 and then processed by the filters 72a, 72b which have the transfer functions $K_0(z)$, $K_1(z)$. The outputs of the filters 72a, 72b are summed by the adder 73 to form the signal Y on line 81. The upsampling operators 71a, 71b, the filters 72a, 72b and the adder 73 form a single filter bank unit 75 of the horizontal processing stage 70.

In accordance with the present invention the filter bank units 14, 19, 22 of FIG. 1, and 68, 69, 75 of FIG. 2 may be implemented as approximately linear phase IIR filter bank units with simple coefficients (i.e. with coefficients which are only powers of two or the sum of two powers of two).

Thus, the filters 12a, 12b of FIG. 1 have the transfer function, $$G_i(z) = \tfrac{1}{2}[1+(-1)^i z_1 T(z_1^2)] i=0,1 \quad (1)$$

where $T(z)$ is allpass with a linear phase response.

Similarly, the filters 17a, 17b, 20a, 20b of FIG. 1 have the transfer function, $$G_{ij}(z) = \tfrac{1}{2}[1+(-1)^j z_2 T(z_2^2)] i,j=0,1 \quad (2)$$

The allpass function $T(z)$ may be the same in Equations 1 and 2 but this is not necessary.

In the horizontal processing stage 70 of the receiving unit 50 of FIG. 2, the filters 72a, 72b have the transfer function, $$K_1(z) = 1+(-1)^l z_1^{-1} T(z_1^{-2}) 1=0,1 \quad (3)$$

Similarly, in the vertical processing stage 60 of the receiving unit 50, the filters 61a, 61b, 62a, 62b have the transfer function $$K_{ij}(z) = 1+(-1)^j z_2^{-1} T(z_2^{-2}) i,j=0,i \quad (4)$$

In Equations (1), (2), (3), (4) above, $z_1$ is the transform variable in the horizontal direction and $z_2$ is the transform variable in the vertical direction.

In the absence of errors introduced by the coding and decoding steps, when the transfer functions of Equations (1), (2), (3) and (4) are utilized, exact reconstruction of a sub-band coded video signal is achieved.

However, a conventional implementation of the IIR filters having the transfer functions indentified in Equations (1), (2), (3), (4) above, is not suitable for the sub-band decomposition and reconstruction of video signals such as HDTV signals. The reason is that very high processing speeds would be required and the synthesis filter banks would require a full video field memory.

Figure 3:
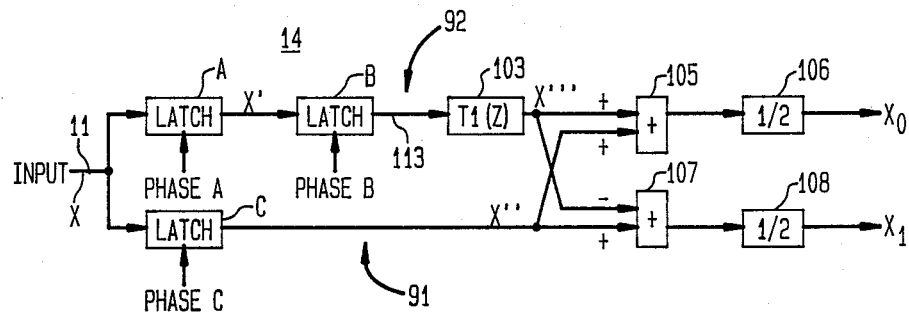
FIG. 3 illustrates a horizontal analysis filter bank for use in transmitting station of FIG. 1, in accordance with an illustrative embodiment of the present invention.

In accordance with the present invention, the analysis filter bank units 14, 19, 22 of FIG. 1 may be implemented as polyphase filter bank units utilizing allpass IIR filters with simple coefficients. A polyphase filter is a filter which operates under the control of multiple phase timing signals. The polyphase filter bank unit 14 of FIG. 1 is illustrated in FIG. 3. In particular, the polyphase filter bank 14 of FIG. 3 performs the functions of the filters 12a, 12b and downsampling operators 13a, 13b of FIG. 1.

As shown in FIG. 3, the input signal X to the filter bank unit 14 is split into two paths 91, 92. The path 92 includes the latches A, B, and the IIR allpass filter 103 with the transfer function $T_1(z)$. The path 91 includes the latch C.

Figure 4:
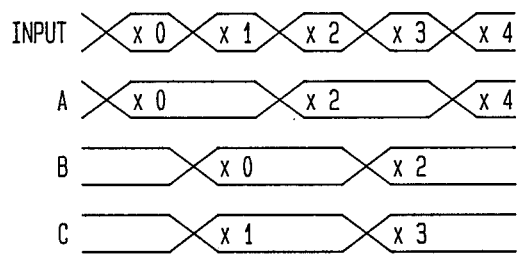
FIG. 4 is a timing diagram for the filter bank of FIG. 3.

The timng of the samples comprising the input signal X which arrives on line 11 of FIG. 3 is shown in the first line of FIG. 4. The samples arrive at the times 0,1,2,3,4, . . . . The latch A latches samples in accordance with phase A shown in the second line of FIG. 4. In particular, the latch A latches every other sample arriving on line 11, i.e., the samples, at times 0,2,4 . . . . The latch C latches samples in accordance with phase C shown in the last line of FIG. 4. In particular, the latch C latches in the alternate samples of the input signal X which are not latched by the latch A, i.e. the samples at the times 1,3 . . . . Thus, the latches A and C serve to divide the input signal X into two signals X',X" of one-half the initial sample-rate. The signal X' in path 92 contains the even number samples of the input signal X' and the signal X" on line 91 contains the odd numbered samples of the input signal X. Thus, the downsampling function has been accomplished. The latch B in the path 92 which is latched according to phase B of FIG. 4, serves to delay the samples in path 92 so that they become synchronous with the samples in the path 91. The signal X' on the path 92 is processed by the allpass filter 103 to produce the signal X'''. The allpass filter 103 passes all frequencies in the relevant pass band and has a linear phase response. It is an advantage of the filter bank 14 that the downsampling function is performed before the processing by the filter 103. This significantly reduces the processing speed required at the filter 103.

The signal $X_0$ l is provided by summing the signals X''', X" at the adder unit 105 and scaling by the coefficient of one-half using the shift-right unit 106. Similarly, the signal $X_1$ is produced by taking the difference of the signals X", X''' and scaling by the coefficient of one-half using the units 107, 108. Since the coefficients represented by the units 106, 107 are powers of two, only shifts are required to implement the units 106, 107.

The all pass filter 103 has the transfer function $$T_1(z)^2 = (az^2+1)/(z^2+a) \quad (5)$$

where illustratively $a=\tfrac{1}{8}$.

Figure 5:
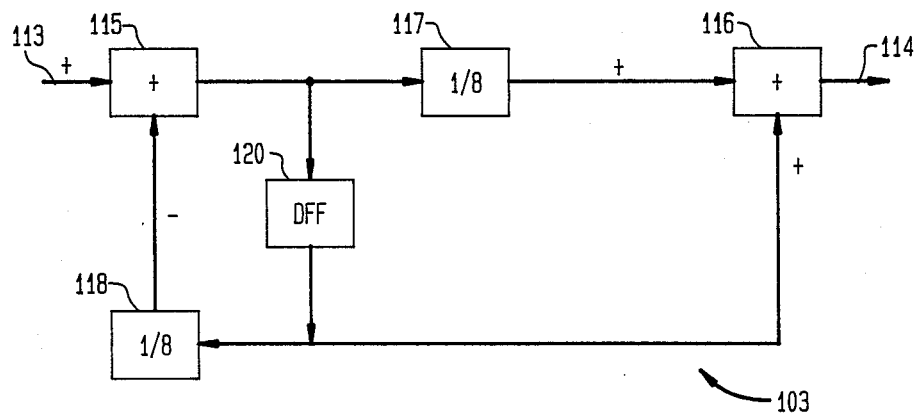
FIG. 5 illustrates an IIR allpass filter for use in connection with the filter bank of FIG. 3.

An implementation of a filter 103 which has the transfer function of Equation 5 is shown in FIG. 5. The signal X' enters the filter 103 via the input 113 and the signal X''' leaves via the output 114. The filter 103 comprises the addition units 115, 116, the shift units 117, 118 and the D type flip flop 120. Since the coefficients supplied by the units 117, 118 are powers of two, the units 117, 118 may be implemented using shifts and no multiplication is required.

In short, the horizontal analysis filter bank 14 of FIG. 1 has been discussed in detail in connection with FIGS. 3, 4, 5. The vertical analysis filter bank units 19 and 22 of FIG. 1 are implemented exactly the same way except that the D flip flop 120 in the filter 103 is replaced by a delay line equal to one-half of the length of an HDTV line. The delay line whose length is one-half the length of an HDTV line results from downsampling a full HDTV line and is required for processing in the vertical direction.

Figure 6:
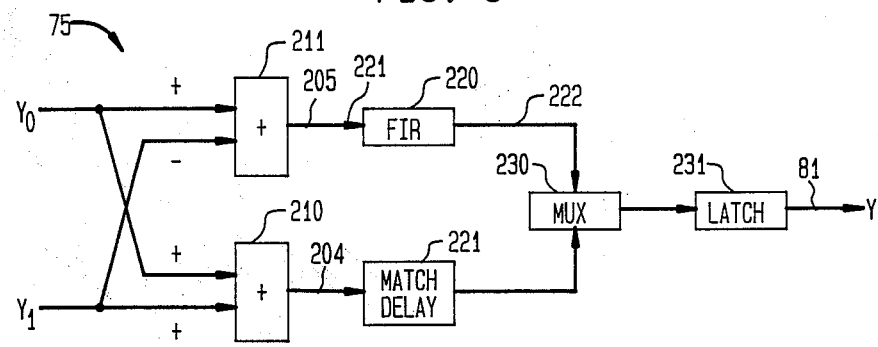
FIG. 6 illustrates a horizontal synthesis filter bank for use in the receiving station of FIG. 2.

The synthesis filter bank units 68, 69, 75 of FIG. 2 are now considered in more detail. In theory, a synthesis filter bank unit can be implemented in exactly the same way as the analysis filter bank units discussed above but with the processing carried out in the reverse direction. However, such an implementation of the synthesis filter bank unit requires memory capacity for a field of a video signal and is not practical. Thus, the horizontal synthesis filter bank 75 of FIG. 6 may be implemented as shown in FIG. 6. The sum of the input signals $Y_0$, $Y_1$ (see FIG. 2) is provided by the addition unit 210 on the path 204 and the difference of the input signals $Y_0$, $Y_1$ is provided by the addition unit 211 on the path 205. To avoid use of a full field memory, in the synthesis filter bank unit 75, the allpass IIR filter $T(z^{-2})$ found in Equation (3) above is replaced by an FIR filter 220 which has approximately the same transfer function.

In particular, the IIR all pass filter with the transfer function $$T(z^{-1}) = [z + \tfrac{1}{8}]/[z/8 + 1]$$

is replaced by an FIR filter 220 with the transfer function $$T(z^{-1}) = \tfrac{1}{8} + (1 - 1/64)[z - z^2/8 + z^3/64]$$

Thus, instead of using an all pass IIR filter in the path 205 of the filter bank unit 75, the FIR filter 220 is substituted. Illustratively, the FIR filter 220 has the transfer function of Equation (7) above. The FIR filter 220 with the transfer function of Equation (7) is shown in greater detail in FIG. 7. In the filter bank 75 of FIG. 6 the path 204 includes a delay unit 221. The delay of the delay unit 221 is chosen so that the signals on paths 204, 205 can be multiplexed together using the multiplex unit 230 and latch unit 231 to form the Y signal on line 81. More particularly, the samples of the signals on path 204 are interleaved with one another by the multiplex unit 230 so that the signal Y has twice the sample rate of the signals $Y_0$, $Y_1$. In this manner, the filter bank unit 75 performs the upsampling function.

Figure 7:
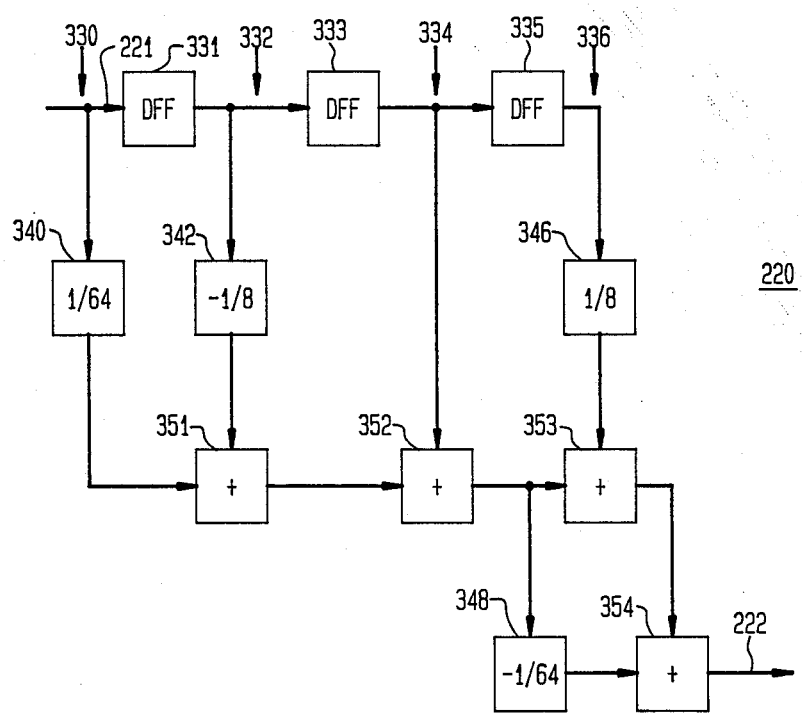
FIG. 7 illustrates an FIR filter for use in connection with the synthesis filter bank of FIG. 6.

Turning to FIG. 7, an FIR filter with the transfer function of Equation (7) is illustrated. The input signal to the filter arrives at the input 221. The FIR filter 220 comprises four stages 330, 332, 334, 336. The stages are separated by the D flipflops 331, 333, 335. The shift units 340, 342, 346 and 348 provide the filter coefficients which are powers of two or sums of powers of two. For this reason, no multiplier units are required in the FIR filter 220. The signal at the filter output 222 is produced using the addition units 351, 352, 353, 354.

The horizontal synthesis filter bank 75 has been discussed in detail in connection with FIGS. 6 and 7. The vertical synthesis filter banks 68, 69 of FIG. 2 are identical except that the D flipflops 331, 333, 335 of FIG. 2 are replaced by delay lines equal in length to one-half of an HDTV video line.

Finally, a class of digital filters has been disclosed which enables use of a sub-band coding technique for video images with minimal computational complexity. In particular, HDTV images may be transmitted at bit rates under 135 Mbits/sec. The above-described embodiments of the invention are intended to be illustrative only. Numerous alternative embodiments may be devised without departing from the spirit and scope of the following claims.

What is claimed is:

1. A method for coding a video signal comprising the steps of
   dividing said video signal into a plurality of sub-band signals by applying said signal to at least one polyphase filter bank unit comprising two signal processing paths one of which paths includes an infinite impulse response allpass filter, and
   reconstructing said video signal by applying said sub-band signal to at least one filter bank unit comprising two signal processing paths one of which includes a finite impulse response filter.

2. The method of claim 1 wherein at least one of said sub-band signals is coded using a discrete cosine transform.

3. The method of claim 1 wherein
   each coefficient of said allpass filter is a power of two, and
   each coefficient of said finite impulse response filter is a power of two or a sum of two powers of two.

4. A device for coding a video signal comprising a sequence of samples, said device comprising:
   at least one filter bank unit for receiving said video signal and for analyzing said video signal into a plurality of sub-band signals,
   said filter bank unit being a polyphase filter bank unit including means for separating said sequence of samples into two sequences of samples at half the rate of said original sequence on two separate paths, means for synchronizing said two sequences of samples, an allpass infinite impulse response filter located in one of said paths, and means for obtaining the sum and difference of said two sequences of samples to obtain said sub-band signals,
   said device further comprising means for coding each of said sub-band signals individually.

5. The device of claim 4 wherein said allpass infinite impulse response filter includes only filter coefficients which are powers of two.

6. The device of claim 4 wherein said device includes further filter bank units for further analyzing said sub-band signals, each of said further filter bank units being a polyphase filter bank unit including means for separating an input sequence of samples into two sequence samples at half the rate of the input sequence on two separate paths, one of said paths including an infinite impulse response allpass filter.

7. A sub-band coding system for a video signal comprising
   a first set of filter bank units for dividing said video signal into a plurality of sub-band signals,
   each of said filter bank units in said first set being a polyphase filter bank unit comprising two signal processing paths, one of which includes an infinite impulse response allpass filter, and
   a second set of filter bank units for synthesizing said video signal from said sub-band signals, each of said filter bank units in said second set comprising two signal processing paths, one of which includes a finite impulse response filter.

* * * * *

UNITED STATES PATENT AND TRADEMARK OFFICE
CERTIFICATE OF CORRECTION

PATENT NO. : 4,918,524
DATED : April 17, 1990
INVENTOR(S) : Rashid Ansari and Antonio Fernandez It is certified that error appears in the above-indentified patent and that said Letters Patent is hereby corrected as shown below:

```
Column 1, line 47, "distortion" should read --distortions--.
Column 4, line 38, "5" should read --50--;
          line 62, delete "1" after "61b ".
Column 5, line 21, delete "1" after "71b ";
          line 65, "indentified" should read --identified--.
Column 6, line 18, "timng" should read --timing--;
          line 47, delete "1" after "X_0".
```

Signed and Sealed this

Nineteenth Day of April, 1994

Attest:

BRUCE LEHMAN

*Attesting Officer*   *Commissioner of Patents and Trademarks*